United States Patent

[11] 3,602,981

[72] Inventor Else Kooi
Emmasingel, Eindhoven, Netherlands

[21] Appl. No. 722,071
[22] Filed Apr. 17, 1968
[45] Patented Sept. 7, 1971
[73] Assignee U.S. Philips Corporation
New York, N.Y.
[32] Priority May 13, 1967
[33] Netherlands
[31] 6706734

[54] METHOD OF MANUFACTURING A SEMICONDUCTOR DEVICE AND SEMICONDUCTOR DEVICE OBTAINED BY CARRYING OUT SAID METHOD
4 Claims, 10 Drawing Figs.

[52] U.S. Cl. ........ 29/571, 29/578, 29/577, 148/187, 29/580
[51] Int. Cl. ........ B01j 17/00, H01g 13/00
[50] Field of Search ........ 29/578, 571, 576 T, 576 IW, 576 J; 317/235; 148/187, 188, DIG. 2

[56] References Cited

UNITED STATES PATENTS

| | | | |
|---|---|---|---|
| 2,875,505 | 3/1959 | Pfann | 29/576 T |
| 3,355,636 | 11/1967 | Becke et al. | 29/576 U |
| 3,390,022 | 6/1968 | Fa | 29/576 IW |
| 3,158,788 | 11/1964 | Last | 29/578 |
| 3,290,753 | 12/1966 | Chang | 29/578 |
| 3,387,358 | 6/1968 | Heiman | 29/578 |
| 3,442,011 | 5/1969 | Strieter | 29/578 |

*Primary Examiner*—John F. Campbell
*Assistant Examiner*—W. Tupman
*Attorney*—Frank R. Trifari

ABSTRACT: A method of making a monolithic semiconductor integrated circuit is described. On a thick silicon wafer is provided an oxidation mask in a desired pattern, and then the surface is thermally oxidized to sink into the silicon surface a sunken oxide pattern. Then impurities are introduced into the silicon surface regions to form PN junctions extending transversely to the surface. Next an insulating support is mounted on the wafer surface, and the backside is lapped or etched off until the sunken oxide pattern is reached forming silicon islands containing transverse PN junctions isolated by the silicon oxide.

INVENTOR.
ELSE KOOI
BY
Frank R. Trifari
AGENT

ELSE KOOI INVENTOR.

BY

AGENT

ELSE KOOI INVENTOR.

BY

AGENT

ELSE KOOI INVENTOR.

BY

AGENT

METHOD OF MANUFACTURING A SEMICONDUCTOR DEVICE AND SEMICONDUCTOR DEVICE OBTAINED BY CARRYING OUT SAID METHOD

The invention relates to a method of manufacturing a semiconductor device comprising a semiconductor silicon body with at least one semiconductor circuit element, in which a substantially flat planar pattern of silicon oxide is sunk over at least part of its thickness in the silicon body by subjecting a surface of the silicon body to an oxidizing treatment, this surface being locally protected against said oxidation.

The mask protecting against the oxidation may be formed by a silicon nitride layer.

The invention has for its object *inter alia* to provide a very important application of this method.

The invention is based *inter alia* on the recognition of the fact that this method may be used particularly advantageously in the manufacture of semiconductor circuit elements in thin semiconductor layers, in which PN junctions are provided which extend substantially right across the semiconductor layer and throughout the thickness thereof. The semiconductor layer is then applied to an insulating substrate.

Such semiconductor circuit elements having PN junctions extending right across the semiconductor layer have *inter alia* the advantage that the area of the PN junction planes may be very small so that the capacitance of such junctions is very low, so that said circuit elements may be appropriate for very high frequencies.

Moreover, a plurality of circuit elements may be satisfactorily insulated from each other by dividing the semiconductor layer into a number of separate portions, each of which may accommodate a circuit element. By establishing conductive connections between the circuit elements and over the insulating substrate an integrated circuit can be obtained. Parasitic transistor effects due to PN junctions provided for insulation are thus avoided.

A disadvantage is, however, that by the division of the semiconductor layer, for example, by etching, the device does no longer exhibit a flat surface, which renders difficult the use of planar methods, particularly the application of conductive metal tracks.

The invention has furthermore for its object to obviate this disadvantage at least for the major part and to avoid the division by etching, which involves the risk of attack of the insulating substrates.

The invention furthermore intends to permit of providing in a simple manner contacts for the circuit elements on both sides of the semiconductor layer, while conductive tracks may cross each other in an insulated manner.

According to the invention a method of the kind set forth is characterized in that in the silicon layer having the pattern sunk throughout its thickness, junctions are provided which extend substantially right across said layer throughout its thickness in order to obtain at least one circuit element, in that the silicon body is reduced to said layer and in that this layer together with the pattern is applied to an insulating support. The junctions may be PN-, $N^+$-$N^1$- or $P^+$-$P^1$- junctions.

According to this method a laminated body is obtained, which consists locally throughout its thickness of silicon oxide and locally throughout its thickness of silicon, while in the silicon PN junctions extend right across the layer and the laminated body is applied to an insulating substrate.

The laminate body, in which the silicon portions may be provided with a protective insulating layer which may serve as a mask during the application of PN junctions, may be substantially flat so that planar methods can be normally employed.

The semiconductor circuit elements applied may be diodes, M.I.S. transistors (metal-insulating-layer semiconductor transistors) and bipolar NPN or PNP transistors.

A silicon layer may be obtained by depositing silicon on a support, for example, a body of alumina, after which a pattern can be provided, said pattern being sunk throughout the thickness of said layer. The silicon body is thus restricted already during the manufacture to the silicon layer. It is thus difficult, however, to obtain a single-crystal silicon layer, while contacts can be provided only on one side of the layer. The method therefore starts preferably from a single-crystal silicon body which is first reduced to the silicon layer in which the pattern has to be sunk throughout the thickness by applying the silicon body to a support and by subjecting its side opposite the support side to a material-removing treatment, after which the silicon layer is subjected to the oxidizing treatment for obtaining the pattern, and the oxidizing treatment is continued until the pattern extends throughout the thickness of the silicon layer. In this manner a single-crystal silicon layer is obtained in which a pattern is sunk, while the layer with the pattern is already provided with a substrate. Before applying the substrate the silicon body may be provided with an insulating and/or protective layer, for example, a silicon oxide layer. The substrate may consist of polycrystalline silicon, which may be applied in a conventional manner to the silica layer.

The junctions for the circuit elements may be provided subsequent to the application of the pattern. The inverse order, in which the pattern is provided after the application of the junctions, is less desirable since the application of the pattern may affect the junctions already provided.

A further preferred form of the method according to the invention is characterized in that the pattern is sunk in a surface layer of a single-crystal silicon body after which the silicon body is subjected on the side opposite the pattern side to a material-removing treatment until the silicon body is reduced to the surface layer throughout the thickness of which the pattern is sunk. The material-removing treatments may be etching and/or grinding treatments. In this way a single-crystal silicon layer is obtained, throughout the thickness of which the pattern is sunk.

The silicon layer, throughout the thickness of which the pattern is sunk, may be thin, for example, 6 $\mu$ or less, often even 2 $\mu$ or less. It is therefore usually desirable to provide the surface layer with the sunken pattern with a support before the silicon body is subjected to the material-removing treatments. The support may be formed by deposited polycrystalline silicon or by other vitreous or ceramic materials, which may be applied, for example, by fusion.

It is advantageous to provide the junctions required for the circuit elements to be manufactured, which junctions extend substantially right across the silicon layer and throughout the thickness thereof, prior to the application of the support. The support need then not be exposed to high diffusion temperatures, which may have technological advantages, while prior to the application of the support contacts may be provided, which need not be exposed either to the high diffusion temperatures.

Since the junctions of the circuit elements extend right across the silicon layer and throughout the thickness thereof, the zones of the circuit elements extend throughout the thickness of the silicon layer. These zones may, in principle, be provided at will on either side of the silicon layer with contacts. This is particularly important in integrated circuits in which conductive tracks connected to zones of the circuit elements may be provided on either side of the silicon layer with the sunken pattern. The conductive tracks may cross each other in a simple manner, while they may be insulated from each other by the pattern. An important preferred form of a method according to the invention is characterized in that prior to the application of the support, conductive connections are applied to the silicon layer with the sunken pattern, which are connected to zones provided in the silicon layer.

After the material-removing treatment the thus exposed surface of the silicon layer and of the pattern may be provided also with conductive connections which are linked to zones in the silicon layer. On both sides of the silicon layer with the sunken pattern conductive connections are thus available.

It should be noted that prior to the application of a support and/or conductive connections to one side of the silicon layer with the sunken pattern an insulating layer, for example, an oxide layer may be applied to the silicon layer, which oxide layer may be provided with windows through which the conductive connections may establish contact with zones of circuit elements. The conductive connections may be formed by aluminum.

In the silicon layer in which the pattern is sunk a field-effect transistor of the type having an insulated gate electrode may be provided, in which case an insulated gate electrode of the field-effect transistor if provided on both sides of the silicon layer. In a simple manner a field-effect transistor having two gate electrodes is thus obtained which is appropriate *inter alia* for mixing electric signals.

The invention furthermore relates to a semiconductor device comprising a silicon layer having at least one circuit element provided with junctions extending substantially right across the layer and throughout the thickness thereof and comprising a planer pattern of silica sunk into the silicon layer throughout out the thickness thereof, manufactured by carrying out a method according to the invention.

The invention will now be described more fully with reference to a few embodiments and the drawings.

Figures 1, 2, 3:
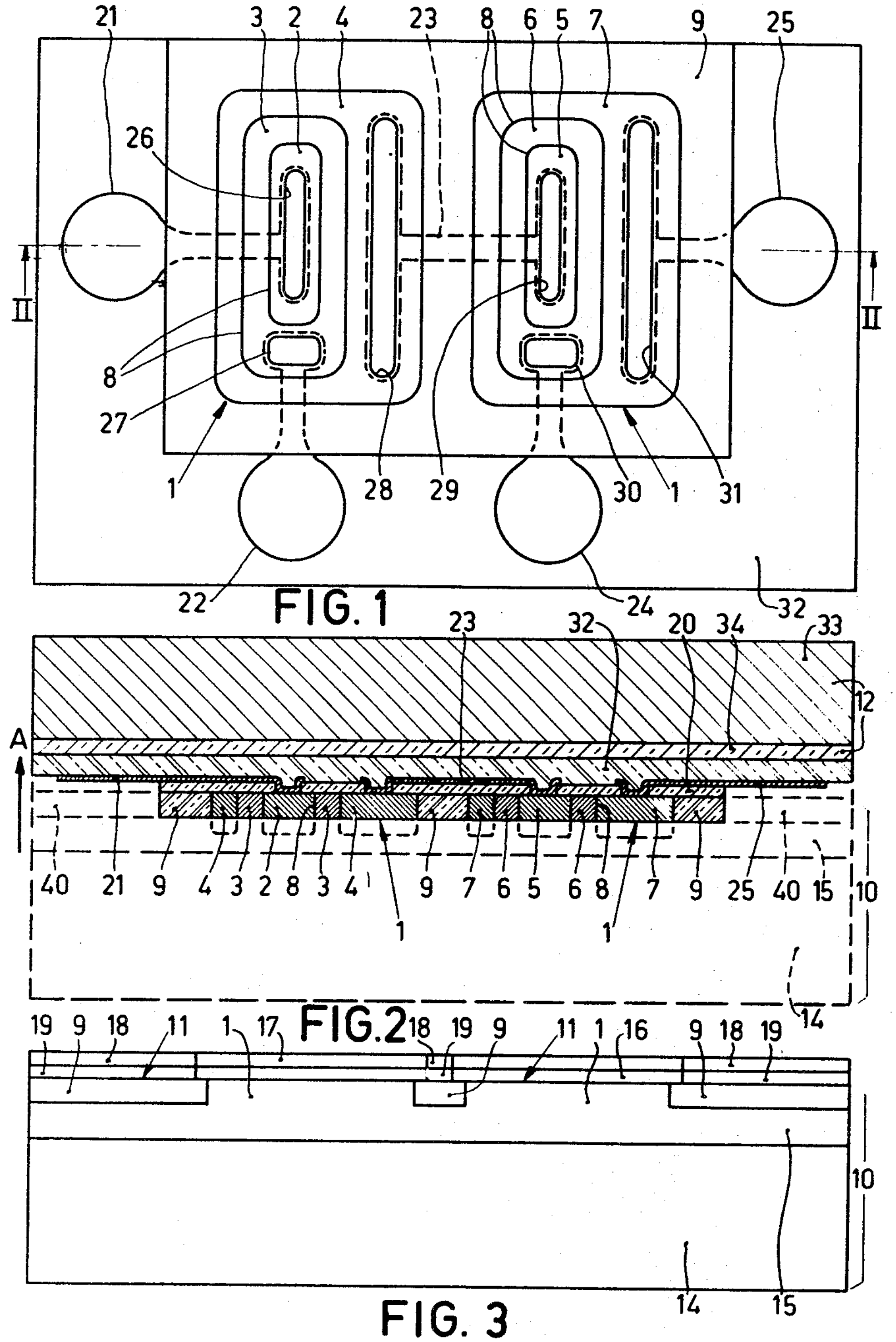
FIG. 1 is a diagrammatic elevation in the direction of the arrow A of FIG. 2 of a semiconductor device manufactured by the method according to the invention.
FIG. 2 is a diagrammatic sectional view of said semiconductor device taken on the line II, II in FIG. 1.
FIGS. 3 and 4 are diagrammatic sectional views of the semiconductor device in two stages of the manufacture.

FIGS. 1 and 2 show an embodiment of a semiconductor device manufactured by a method according to the invention. The semiconductor device comprises a silicon layer 1 having two circuit elements, that is to say, a transistor having an emitter zone 2, a base zone 3 and a collector zone 4 and a transistor having an emitter zone 5, a base zone 6 and a collector zone 7. The circuit elements have junctions 8 extending substantially right across the layer 1 throughout the thickness thereof. There is furthermore provided a planar pattern 9 of silica, extending throughout the thickness of the layer 1. In this embodiment comprising comprising two transistors the collector zone 4 of one transistor is connected via a conductive connection 23 to the emitter zone 5 of the other transistor, whereas the further zones of the transistors are provided with the conductive connections 21, 22, 24 and 25, to which conductors may be connected.

The semiconductor device shown in Figs. 1 and 2 is manufactured by a method in which a silicon body 10 (FIG. 3) is provided with a sunken substantially flat, planer pattern 9 of silica by subjecting the surface 11 of the body 10 to an oxidizing treatment while the surface 11 is locally protected against the oxidation.

According to the invention the silicon layer 1 in which the pattern 9 is sunk throughout the thickness thereof is provided, for obtaining the circuit elements, with junctions 8 (Fig. 4) so that they extend substantially right across the layer 1 throughout the thickness thereof, while the silicon body 10 is reduced to the layer 1 and the layer 1 together with the pattern 9 is applied to an insulating substrate 12 (Fig. 2). In Fig. 2 removed parts are indicated by broken lines.

By depositing silicon on a substrate, for example, of alumina, a silicon layer may be directly obtained, in which a pattern may be sunk throughout the thickness.

However, the embodiment of the method according to the invention to be described hereinafter starts with a single-crystal silicon body 10, in a surface layer 1 of which the pattern 9 is sunk, after which the silicon body 10 is subjected on the side 13 opposite the pattern side 11 to material-removing treatments until the silicon body 10 is reduced to the layer 1 throughout the thickness of which the pattern 9 is sunk.

The basic silicon body 10 may consist of an N-type silicon substrate 14 (FIG. 3) of about 200 $\mu$ thickness and of a resistivity of about 0.01 ohm. cm., to which an N-type epitaxial silicon layer 15 is applied which has a thickness of about 10 $\mu$ and a resistivity of about 2 ohm. cm.

The further dimensions of the body 10 are not essential. In a conventional manner a great number of semiconductor devices may be arranged simultaneously in the body 10, which is subsequently divided to obtain separate semiconductor devices. For the sake of simplicity the manufacture of only one semiconductor device will be described hereinafter.

To the epitaxial layer 15 is applied a silicon nitride layer 16 of a thickness of about 0.3 $\mu$. This layer may be applied in a conventional manner by passing over a gaseous mixture of silicon and ammonia.

The layer 16 is provided with a silica layer 17 of a thickness of about 0.3 $\mu$, for example, by depositing in a conventional manner silica from the gaseous phase.

Then the portions 18 of the oxide layer 17 are removed by a conventional photoresist technique and an etchant.

The thus exposed portions 19 of the nitride layer 16 are removed by etching with phosphoric acid (substantially 100 percent) at a temperature of about 230° C. for about 15 minutes.

The remaining parts of the nitride layer 16 serve as a mask for the next oxidizing treatment for obtaining the pattern 9.

The surface parts of the epitaxial layer 15 exposed by the removal of the parts 18 and 19 of the layers 17 and 16 respectively are subjected to an oxidizing treatment.

For this purpose steam of a pressure of about 1 atmosphere and a temperature of about 1000° C. is passed over for about 16 hours. This results in an oxide layer of about 2 $\mu$ thickness, which is sunk in the epitaxial layer 15 over about 1 $\mu$. By etching in hydrofluoric acid (50 percent by weight) this oxide layer, which projects by about 1 $\mu$ above the epitaxial layer 15, is removed.

The oxidizing treatment is then repeated, after which a pattern 9 of about 2 $\mu$ thickness of silica is obtained, which is sunk in the epitaxial layer 15 throughout its thickness. My copending application, Ser. No. 672,622, filed Oct. 3, 1967, describes in detail other ways of accomplishing the foregoing, the contents of which applications are hereby incorporated by reference.

Before the silicon body 10 is applied to a support, the junctions 8 required for the desired circuit elements (FIG. 4) are provided so that they extend substantially right across the surface layer 1 throughout the thickness thereof.

The PN junctions 8 may be obtained by diffusion of an impurity inducing P-type conductivity. The remaining parts of the silicon nitride layer 16 may be used as a diffusion mask.

In the present embodiments, however, first the remaining parts of the nitride layer 16 are removed by means of phosphoric acid, after which a silicon oxide layer 20 (FIG. 4) of a thickness of about 0.3 $\mu$ is provided for example by depositing in a conventional manner silicon oxide from the gaseous phase.

Then the P-type emitter zones 2 and 5 and the P-type collector zones 4 and 7 (see also Fig. 1) are provided, for example, by conventional diffusion of boron through windows in the oxide layer 20 obtained in a conventional manner by a photoresist technique and an etchant. The zones 2, 4, 5 and 7 may have a thickness of about 3 $\mu$.

The semiconductor body 10 may be fixed to a support, after which the body 10 may be subjected on the side 13 to material-removing treatments until the body 10 is reduced to the surface layer 1 with the sunken pattern 9. The surface of the zones 2, 3, 4, 5, 6 and 7 thus exposed may then be provided with electrical connections.

In the present embodiment, however, the silicon layer 1 with the sunken pattern 9 is provided with conductive connections 21, 22, 23, 24 and 25, which are connected through the windows 26, 27, 28, and 29, 30 and 31 respectively in the oxide layer 20 (see Fig. 1) to the zones 2, 3, 4 and 5, 6, 7 in the layer 1 before the body 10 is applied to a support. The conductive connections may consist of aluminum and may be provided in a conventional manner.

It should be noted that in the elevation of FIG. 1 the window 26 to 31 are not visible, since the elevation is drawn in the direction of the arrow A of FIG. 2. For the sake of clarity said windows are traced in FIG. 1, but in this Figure they have to be imagined to lie beneath the silicon layer 1 instead of lying on it. It should furthermore be noted that crosshatchings are omitted from FIG. 3 for the sake of clarity.

The surface layer 1 with the sunken pattern 9 is provided with a support 12, after which the silicon body is subjected to material-removing treatments (see FIG. 2).

The support 12 may consist of a glass or of alumina. In the present embodiment the support 12 is formed by a silicon body 33 having a silicon oxide layer 34. The silicon body may have a thickness of a few hundred microns and the oxide layer may have a thickness of about 1 $\mu$.

The support 12 and the silicon body 10 provided with the oxide layer 20 and the conductive connections 21 to 25 are pressed against each other with the interposition of a layer of powdery polyvinylacetate, the assembly being heated at a temperature of about 250° C. so that the powder melts. After cooling the support 12 is fixed to the body 10 by a layer 32 of polyvinylacetate of a thickness of about 20 $\mu$.

Then the substrate 14 is removed by anodic etching in hydrofluoric acid (5 percent by weight), while the surface of the silicon substrate 14 is traversed by a current of about 0.5. a./cm$^2$.

By chemical etching in a mixture of hydrofluoric acid and nitric acid in a ratio of 1 percent by volume (50 percent by weight) of HF and 5 percent of volume (60 percent by weight) of $HNO_3$ the epitaxial layer 15 is then removed over part of its thickness up to the pattern 9 so that only the surface layer 1 is left.

In order to expose the circular contact areas of the conductive connections 21 to 25, a rim 40 of the pattern 9 is removed by conventional etching by means of a photoresist technique. In FIG. 2 the removed parts are indicated by broken lines.

The free bottom side of the layer 1 with the pattern 9 may be covered by a protective layer. The latter may consist of silicon oxide and may be applied by deposition of silicon oxide from the gaseous phase.

Figures 4, 5, 6:
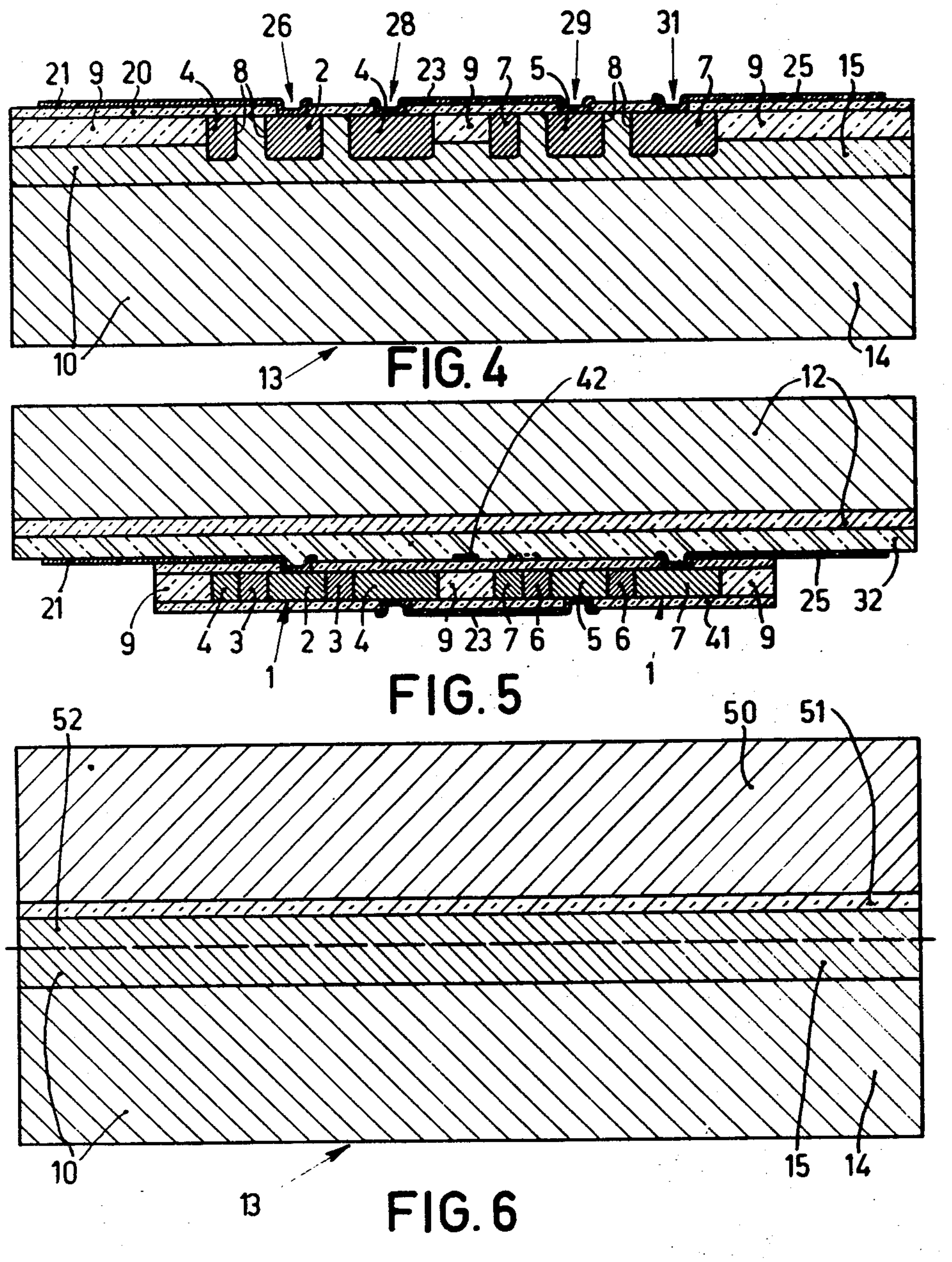
FIG. 5 is a diagrammatic sectional view of an embodiment slightly differing from that of FIG. 2.
FIG. 6 is a diagrammatic sectional view of —a semiconductor body provided with a substrate.

FIG. 5 shows a sectional view like FIG. 2 and in FIG. 5 this oxide layer is designated by 41.

If desired, all conductive connections or a plurality thereof may be provided on the bottom side of the layer 1 with the pattern 9.

In the embodiment shown in FIG. 5 the conductive connection 23 is provided, not on the upper side, but on the lower side of the silicon layer 1 with the sunken pattern 9. On both sides of the silicon layer 1 with the sunken pattern 9 conductive connections are thus available.

In complicated integrated circuits having a great number of circuit elements crossings of conductive connections are often desired. FIG. 5 illustrates how such a crossing may be obtained in a simple manner in a device according to the invention. The conductive connection 42, which extends substantially at right angles to the plane of the drawing, crosses the conductive connections 23. At the crossing the connections 42 and 23, which are provided on opposite sides of the layer 1 with the pattern 9, are insulated from each other by a part of the pattern 9.

The conductive connection 42 may extend also across the zones 7 and/or 6, as is indicated by a broken line. Also in this case the conductive connections 42 and 23 are insulated from each other, but the conductive connection 42 forms a capacitance with the zone 7 and/or 6, which may be undesirable.

It should be noted that at the contact areas of a conductive connection to a semiconductor zone a more highly doped contact zone may be provided in the semiconductor zone in order to improve the contact. In the N-type base zones 4 and 7, at the areas of the windows 27 and 30 in the oxide layer 20 (see FIG. 1), highly doped N-type contact zones may be provided, which may extend throughout the thickness of the semiconductor layer. These highly doped zones may be obtained by conventional diffusion of phosphorous into the zones 4 and 7. The diffused zones 2, 4, 5 and 7 are in general sufficiently doped for ensuring a satisfactory contact with a conductive connection.

In the elevation of FIG. 1, for example, the emitter zones 2 and 5 have dimensions of 30×60 $\mu$, the base zones 3 and 6 dimensions of 35×80 $\mu$ and the collector zones 4 and 7 (i.e. the two parts of the silicon layer 1) dimensions of 80×100 $\mu$. The windows 26 and 29 may have dimensions of 25×55 $\mu$, the windows 27 and 30 dimensions of 10×30 $\mu$ and the windows 28 and 31 dimensions of 80×15 $\mu$. The approximately circular parts of the connections 21 to 25 may have a diameter of about 50 $\mu$. The distance between the collector zones 4 and 7 may be about 20 $\mu$.

Prior to the application of a support it is not necessary to provide the pattern 9 and the diffused zones 2, 4, 5 and 7 in the silicon layer 10 (FIGS. 3 and 4). In a further important mode according to the invention the manufacture starts from a single-crystal silicon body 10 (FIG. 6), which may comprise like in the preceding embodiment, an N-type substrate 14 provided with an N-type epitaxial layer 15. A support 50 is applied to this body 10. For this purpose the epitaxial layer 15 is first provided with a silicon oxide layer 51 of a thickness of about 1 $\mu$, which is subsequently provided with a body 50 of polycrystalline silicon of a thickness of about 200 $\mu$. The layer 51 and the body 50 may be obtained both in a conventional manner, for example, by the deposition of silicon oxide and silicon respectively from the vapor phase. Then the side 13 of the body 10 is subjected to material-removing treatments until the body 10 is removed up to the broken line and only the surface layer 52 is left. In this layer 52 of a thickness of, for example, 2 $\mu$ a pattern can be sunk throughout the thickness and diffused zones may be provided. The pattern and the diffused zones may be obtained in the manner described with reference to the preceding embodiment. Then conductive connections may be provided on the lower side of the layer 52.

In the present embodiment the basic material is a single-crystal silicon body 10, which is first reduced to the silicon layer 52, in which the pattern has to be sunk throughout the thickness thereof by applying the silicon body 10 to a support 50 and by subjecting it on the side 13 opposite the support side to material-removing treatments, after which the silicon layer 52 is exposed to an oxidizing treatment for obtaining the pattern, said oxidizing treatment being continued until the pattern extends throughout the thickness of the silicon layer.

If desired, conductive connections may be provided on the oxide layer 51 and be brought into contact with the epitaxial layer 15 through windows in the oxide layer 51 before the support 50 is applied. However, these conductive connections have to be able to withstand the temperature required for the diffusion of an impurity. Therefore, these connections must not be made of aluminum; they have to be made of a high melting-point metal, for example tungsten.

The semiconductor device shown in FIGS. 1 and 2 comprises two transistors. It will be obvious that devices comprising a larger number of transistors and/or other circuit elements such as resistors, diodes, capacitors and field-effect transistors may be manufactured by a method according to the invention.

The manufacture of a diode requires only that in part of the silicon layer with the sunken pattern only one PN junction should be provided right across the layer. A capacitor may be obtained by providing part of the pattern on both sides with a metal layer. A resistor may consist of a strip-shaped portion of the silicon layer bounded by the pattern and provided near its ends with electrical connections or it may be formed by a metal layer applied to the pattern.

A PNP-field-effect transistor of the type having an insulated gate electrode may be obtained by providing two P-type zones 62 and 63 in a portion 60 (see FIGS. 7 and 8) of an N-type silicon layer, in which pattern 61 is sunk, by the diffusion of an impurity, while an N-type region 64 is left between said zones. The zones 62 and 63 are the source and drain zones provided with the conductive connections 65 and 66, which are in contact through the windows 67 and 68 in the silicon oxide layer 69 with the zones 62 and 63. The oxide layer 69 is provided with a gate electrode 70, insulated from the region 64.

Figure 7:
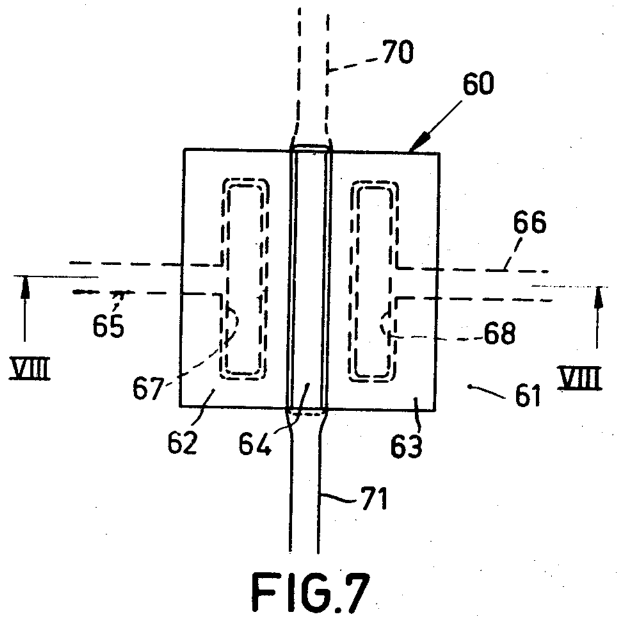
FIG. 7 is a diagrammatic elevation in the direction of the arrow B in Fig. 8 of part of a further embodiment of a semiconductor device according to the invention.
Figure 8:
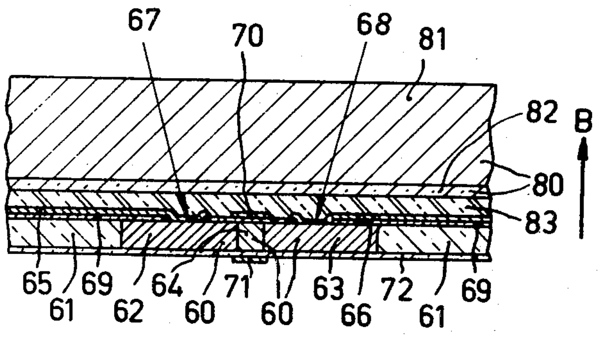
FIG. 8 is a diagrammatic sectional view thereof taken on the line XIII, XIII in Fig. 7.

FIG. 7 is an elevation in the direction of the arrow B of FIG. 8 of the semiconductor layer 60 with the sunken pattern 61. The conductive connections 65 and 66 in the windows 67 and 68 and the gate electrode 70 are indicated in FIG. 7 by broken lines.

The device shown in FIGS. 7 and 8 may be manufactured in a manner similar to that described with reference to the embodiments of FIGS. 1, 2 and 5, in which a support 80, formed by a silicon body 81 and a silicon oxide layer 82 can be applied by means of a layer of polyvinylacetate 83.

In an important embodiment of a method according to the invention a field-effect transistor of the type having an insulated gate electrode is provided in the silicon layer 60, while on either side of the silicon layer 60 an insulated gate electrode 70 and 71 respectively of the field-effect transistor is provided.

For this purpose the silicon oxide layer 72 is provided, to which the gate electrode 71 is subsequently applied.

FIGS. 7 and 8 show only the part of a semiconductor device which comprises a field-effect transistor. The semiconductor device may furthermore comprise a number of circuit elements to which conductors 65, 66, 70 and 71 may be connected. It is furthermore possible for the semiconductor device to comprise only the field-effect transistor, while the conductors 65, 66, 70 and 71 are provided with widened parts to which connections can be made. By removing part of the pattern such widened parts of the conductors 65, 66 and 70 can be exposed in the manner described for the conductors 21 to 25 of FIG. 1.

Obviously, the invention is not restricted to the embodiments described above; within the scope of the invention many variants are conceivable to those skilled in the art.

Figure 9:
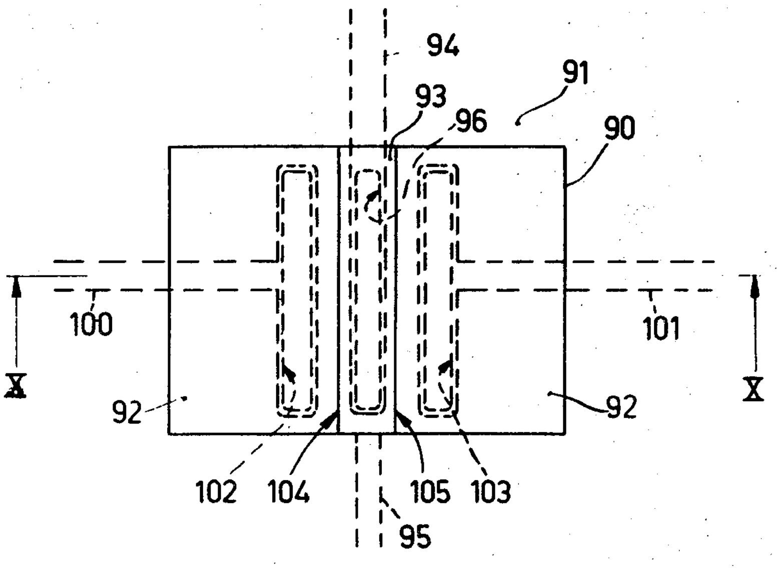
FIG. 9 is a diagrammatic elevation of a last embodiment of a semiconductor device according to the invention.
Figure 10:
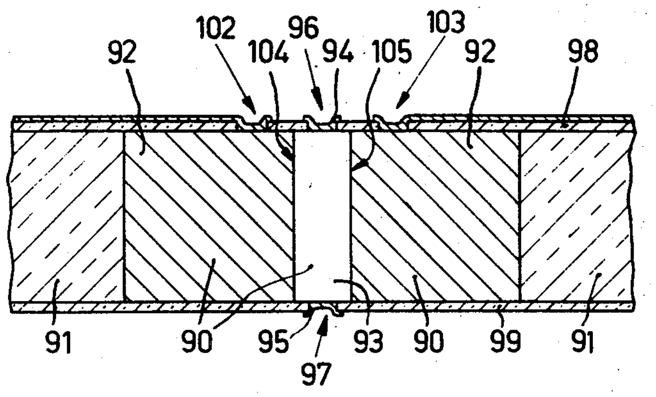
FIG. 10 is a diagrammatic sectional view thereof taken on the line X, X in Fig. 9.

In the last-mentioned embodiment, for example, a NPN-, a $N^+$—N—$\alpha^{N+}$ or a $P^+$—N—$P^+$ field-effect transistor may be provided instead of a PNP transistor. In a coherent portion of the silicon layer with the sunken pattern more than one circuit element may be provided. Other circuit elements than those mentioned above may be provided. FIGS. 9 and 10 show a part 90 of a silicon layer having a sunken silicon oxide pattern 91. The part 90 comprises two P-type zones 92 and an N-type zone 93. The N-type zone 93 has two conductive connections 94 and 95, which are in contact through windows 96 and 97 in the silicon oxide layers 98 and 99 with the zone 93 and form the source and drain electrodes of the field-effect transistor whose zone 93 is the channel and the zones 92 are gate-electrode zones. The conductive connections 100 and 101 are in contact through the windows 102 and 103 in the oxide layer 98 with the zones 92. The field-effect transistor of FIGS. 9 and 10 thus has two gate electrodes which form the PN junctions 104 and 105, extending right across the silicon layer, and the channel 93, while in operation the current between the source and drain electrode passes right across the silicon layer 90. FIG. 9 is a plan view of the silicon layer 90 with the sunken pattern 91, while for the sake of clarity the windows 96, 102 and 103 and the conductive connections 94, 95, 100 and 101 are indicated by broken lines. In a manner similar to that of the embodiments described above a support may be provided. FIGS. 9 and 10 do not show this support for the sake of clarity. It should be noted that junctions provided by diffusion of an impurity in a silicon layer so that they extend right across the silicon layer throughout the thickness thereof are in general not accurately parallel to the direction of thickness of said layer as is indicated in the Figures.

What is claimed is:

1. A method of manufacturing a semiconductor device comprising subjecting surface portions on the top surface of a single-crystal silicon body to a thermal oxidizing treatment while protecting other surface portions from the oxidation to sink into the top surface a substantially flat planar pattern of silicon oxide only over part of its thickness to form a top surface layer of the silicon containing the sunken oxide pattern, introducing into the said surface layer of the silicon from the said top surface impurities to form within the silicon regions separated by the oxide pattern PN junctions which extend transverse to the surface layer and substantially right across said surface layer throughout its thickness, thereafter providing an insulating support for the body connected to its top surface and thus at the silicon surface layer containing the sunken oxide pattern, thereafter subjecting the thus-supported silicon body on the side opposite the sunken oxide pattern to a material-removing treatment until the silicon body is reduced to the thickness of the said silicon surface layer with the sunken oxide pattern extending throughout the thickness of said layer forming isolated silicon regions containing PN junctions extending transversely throughout the regions, and making connections to the silicon regions to form circuit elements.

2. A method as set forth in claim 1 wherein also prior to the silicon body being provided on the support, connections are provided on the silicon surface layer so as to contact zones in the silicon regions.

3. A method as set forth in claim 1 wherein conductive interconnections between various zones in the various silicon regions are provided on both sides of the silicon layer with the incorporated oxide pattern.

4. A method as set forth in claim 3 wherein one of the silicon regions is provided with a field-effect transistor of the type having an insulated gate with an insulated gate being provided on opposite sides of the silicon region.

PO-1050 (5/69)

UNITED STATES PATENT OFFICE
CERTIFICATE OF CORRECTION

Patent No. 3602981 Dated September 7, 1971

Inventor(s) Else Kooi

It is certified that error appears in the above-identified patent and that said Letters Patent are hereby corrected as shown below:

Column 1, line 58, "PN-,$N^{+}$-$N^{1}$- or $P^{+}$-$P^{1}$-" should read -- pn-, $N^{+}$-$N^{-}$- or $P^{+}$-$P^{-}$- --;

Column 2, line 66, the comma (,) should be deleted;

Column 3, line 10, "if provided" should read -- is provided --;

line 19, the word "out" should be deleted;

line 53, one of the words "comprising" should be deleted;

Column 4, line 49, after "15" the word "substantially" should have been inserted;

line 52, "applications" should read -- application;

Column 7, line 52, "$N^{+}$-N-$a^{N+}$ or a $P^{+}$-N-$P^{+}$" should read -- $N^{+}$-N-$N^{+}$ or a $P^{+}$-P-$P^{+}$ -- ;

Column 8, line 47, the word "also" should have been deleted.

Signed and sealed this 14th day of March 1972.

(SEAL)
Attest:

EDWARD M.FLETCHER,JR.
Attesting Officer

ROBERT GOTTSCHALK
Commissioner of Patents